United States Patent
Ogasawara

(10) Patent No.: US 11,113,162 B2
(45) Date of Patent: *Sep. 7, 2021

(54) APPARATUSES AND METHODS FOR REPAIRING MEMORY DEVICES INCLUDING A PLURALITY OF MEMORY DIE AND AN INTERFACE

(71) Applicant: Micron Technology, Inc., Boise, ID (US)

(72) Inventor: Masashi Ogasawara, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/352,743

(22) Filed: Mar. 13, 2019

(65) Prior Publication Data
US 2019/0213094 A1    Jul. 11, 2019

Related U.S. Application Data

(63) Continuation of application No. 15/808,771, filed on Nov. 9, 2017, now Pat. No. 10,282,264.

(51) Int. Cl.
*G06F 11/20* (2006.01)

(52) U.S. Cl.
CPC .... *G06F 11/2094* (2013.01); *G06F 2201/805* (2013.01)

(58) Field of Classification Search
CPC .................. G06F 11/2094; G06F 2201/805
See application file for complete search history.

(56) References Cited

U.S. PATENT DOCUMENTS

| | | | |
|---|---|---|---|
| 9,432,298 B1* | 8/2016 | Smith | H04L 49/9057 |
| 10,074,579 B1* | 9/2018 | Kim | G11C 29/025 |
| 10,079,049 B2 | 9/2018 | Shido | |
| 10,304,505 B2 | 5/2019 | Shido | |
| 2003/0145145 A1 | 7/2003 | Muroor et al. | |
| 2008/0028137 A1 | 1/2008 | Schakel et al. | |
| 2011/0085403 A1 | 4/2011 | Nishioka et al. | |
| 2012/0008436 A1 | 1/2012 | Rajan et al. | |
| 2012/0263003 A1 | 10/2012 | Sakakibara et al. | |
| 2013/0153898 A1 | 6/2013 | Takahashi et al. | |
| 2013/0159587 A1 | 6/2013 | Nygren et al. | |
| 2013/0339820 A1 | 12/2013 | Cordero et al. | |
| 2014/0006699 A1 | 1/2014 | Bains et al. | |

(Continued)

*Primary Examiner* — Mohammed A Bashar
(74) *Attorney, Agent, or Firm* — Dorsey & Whitney LLP

(57) ABSTRACT

Apparatuses and methods for repairing memory devices including a plurality of memory die and an interface are disclosed. An example apparatus includes a first stack that includes a plurality of first dies stacked with one another, the first dies include a plurality of first channels, at least one of which is designated as a first defective channel, and further includes a second stack stacked with the first stack and including a plurality of second dies stacked with one another, the second dies including a plurality of second channels, at least one of which is designated as a second defective channel. A control circuit is configured, responsive to a command for accessing the first defective channel, to access one of the plurality of second channels in place of accessing the first defective channel, wherein the one of the plurality of second channels corresponds to the first defective channel and is not designated as the second defective channel.

20 Claims, 10 Drawing Sheets

(56) References Cited

U.S. PATENT DOCUMENTS

| | | |
|---|---|---|
| 2015/0162068 A1 | 6/2015 | Woo et al. |
| 2017/0125119 A1* | 5/2017 | Loh ........................ G11C 17/16 |
| 2017/0358336 A1 | 12/2017 | Shido |
| 2019/0035442 A1 | 1/2019 | Shido |
| 2019/0237116 A1 | 8/2019 | Shido |

* cited by examiner

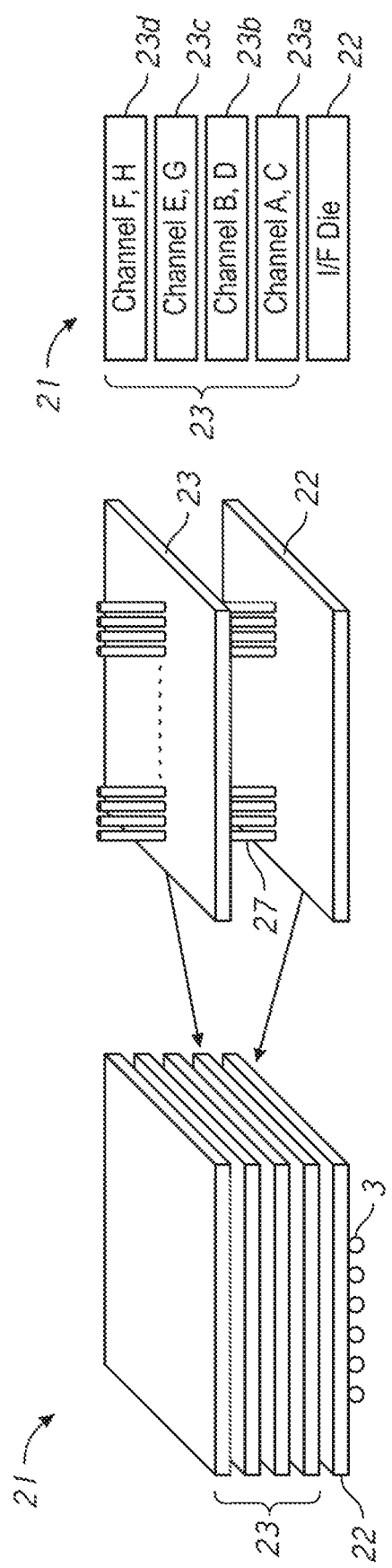

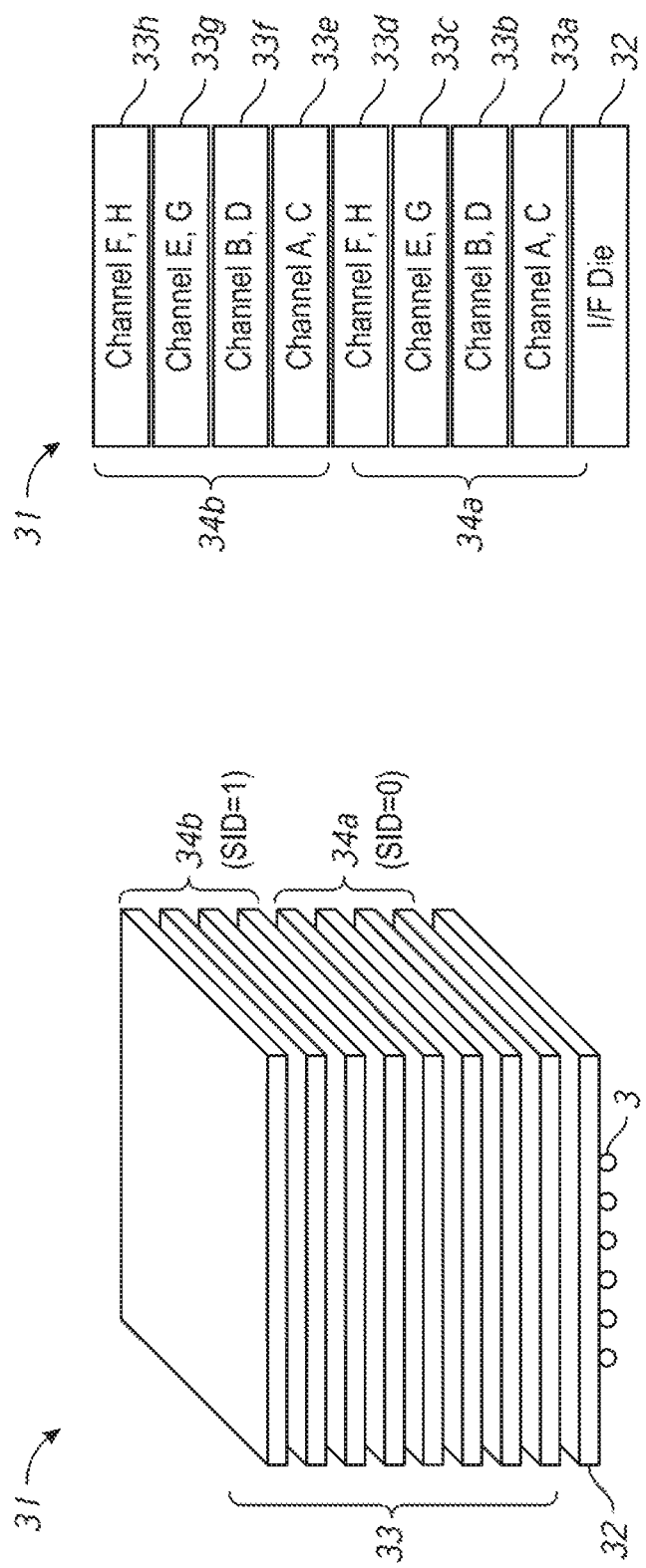

APPARATUSES AND METHODS FOR REPAIRING MEMORY DEVICES INCLUDING A PLURALITY OF MEMORY DIE AND AN INTERFACE

CROSS-REFERENCE TO RELATED APPLICATION

This application is a continuation of U.S. patent application Ser. No. 15/808,771, filed Nov. 9, 2017, U.S. Pat. No. 10,282,264 issued on May 7, 2019. This application and patent are incorporated by reference herein in their entirety and for all purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking memory dies (or "dice") vertically and interconnecting the memory dies using through-silicon (or through-substrate) vias (TSVs). Benefits of the 3D memory devices include shorter interconnects which reduce signal delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM). For example, High Bandwidth Memory (HBM) is a type of memory including a high-performance dynamic random access memory (DRAM) interface die and vertically stacked DRAM dies.

After assembly of the stacked memory dies and interface die, the memory device cannot be easily disassembled in the event one or more of the stacked memory dies become inoperable. A memory die may become inoperable tor a variety of reasons, for example, one or more of the circuits of the memory die do not function properly, memory cells of the memory die are defective and cannot correctly and/or adequately store data, etc. Although each die typically includes a limited amount of redundant memory circuits for repairing defective memory cells, the redundant memory circuits may not be capable of repairing all defective memory cells of the memory die, and additionally, inoperable circuits of a memory die may not be repairable. As a result of one or more inoperable memory dies assembled in the stack, if an inoperable die cannot be repaired in place, the entire memory device is scrapped, even if several of or all other memory dies in the stack and the interface are operable.

It may be desirable to provide repairability to memory devices having a plurality of memory dies and an interface die in order to recover an operable memory device although one or more of the memory dies is inoperable.

BRIEF DESCRIPTION OF THE DRAWINGS

FIG. 2A is a schematic diagram of a memory device stack including an interface (I/F) die and a plurality of core dies.

FIG. 2B is a schematic diagram of a portion of the memory device stack of FIG. 2A.

FIG. 2C is a schematic diagram of the memory device stack of FIG. 2A including the I/F die and the plurality of core dies.

FIG. 3A is a schematic diagram of a memory device stack including an interface (I/F) die and a plurality of core dies according to an embodiment of the disclosure.

FIG. 3B is a schematic diagram of the memory device stack of FIG. 3A including the I/F die and the plurality of core dies according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
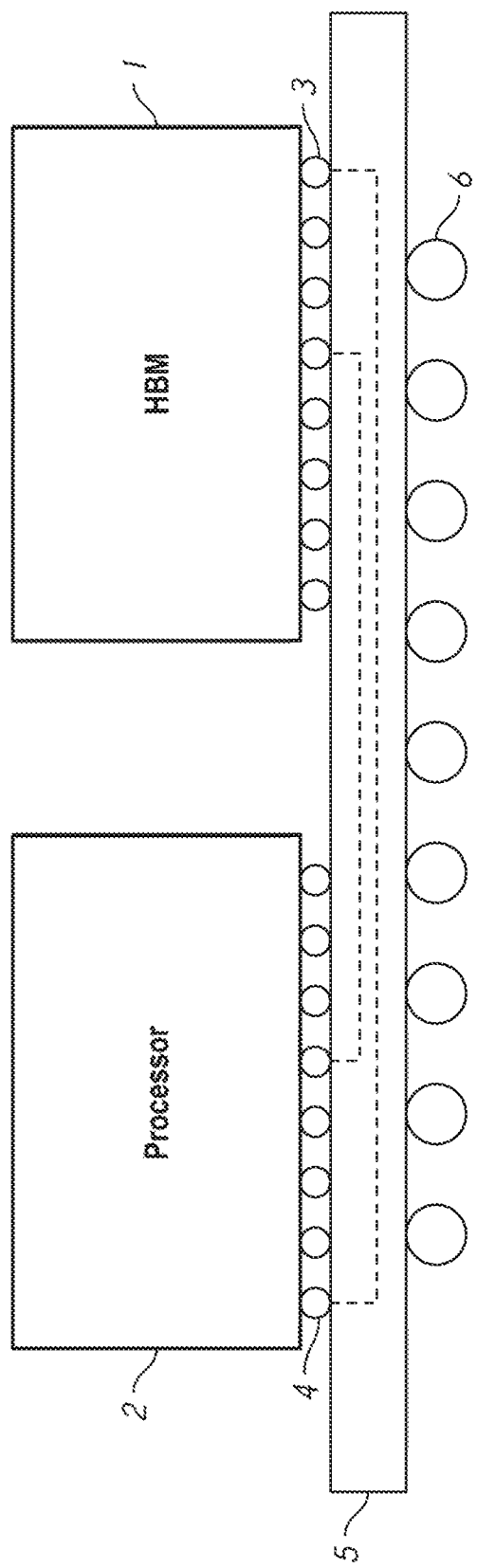
FIG. 1 is a wiring diagram of a memory device and a processor according to an embodiment of the disclosure.

FIG. 1 is a wiring diagram of a memory device 1 and a processor 2 according to an embodiment of the disclosure. In some embodiments of the disclosure, the memory device 1 is a High Bandwidth Memory (HBM). In some embodiments of the disclosure, the processor 2 may be a graphical processor unit or a memory controller. The memory device 1 may include terminals coupled by balls 3 (e.g., microbumps) to an interposer 5. The processor 2 may include terminals coupled by balls 4 (e.g., microbumps) to the interposer 5 and further to the corresponding terminals of the memory device 1 through the interposer 5. The interposer may be stacked on a packaging substrate (not shown) by balls 6. For example, the interposer 5 may be made of silicon.

FIG. 2A is a schematic diagram of a memory device slack including an interface (I/F) die 22 and a plurality of DRAM core dies 23. For example, the number of the plurality of core dies 23 in the memory device slack 21 may be four. Each of the core dies 23 may lie a memory die including a memory array for storing data and further including circuits for performing memory operations. FIG. 2B is a schematic diagram of a portion of the memory device stack 21. The I/F die 22 and the plurality of core dies 23 may be coupled by a plurality of conductive vias 27 (e.g., through silicon (substrate) via (TSV)). The I/F die 22 may be on the balls 3. For example, a combination of the conductive vias 2 and the balls 3 may function as interconnects. FIG. 2C is a schematic diagram of the memory device stack 21 including the I/F die 22 and the plurality of core dies 23. The memory device stack 21 may have two 128-bit channels per core die for a total of eight input-output channels and a width of 1024 bits in total. For example, each core die of the plurality of the core dies 23 may include two channels. A channel of a core die represents a separable addressable memory space that may be accessed to read data from the channel and to write data to the channel. In this example, the core dies 23a, 23b, 23c and 23d include Channels A and C, Channels B and D, Channels E and G, and Channels F and H, respectively. For example, a clock frequency, a command sequence, and data can be independently provided for each channel.

Figure 4A:
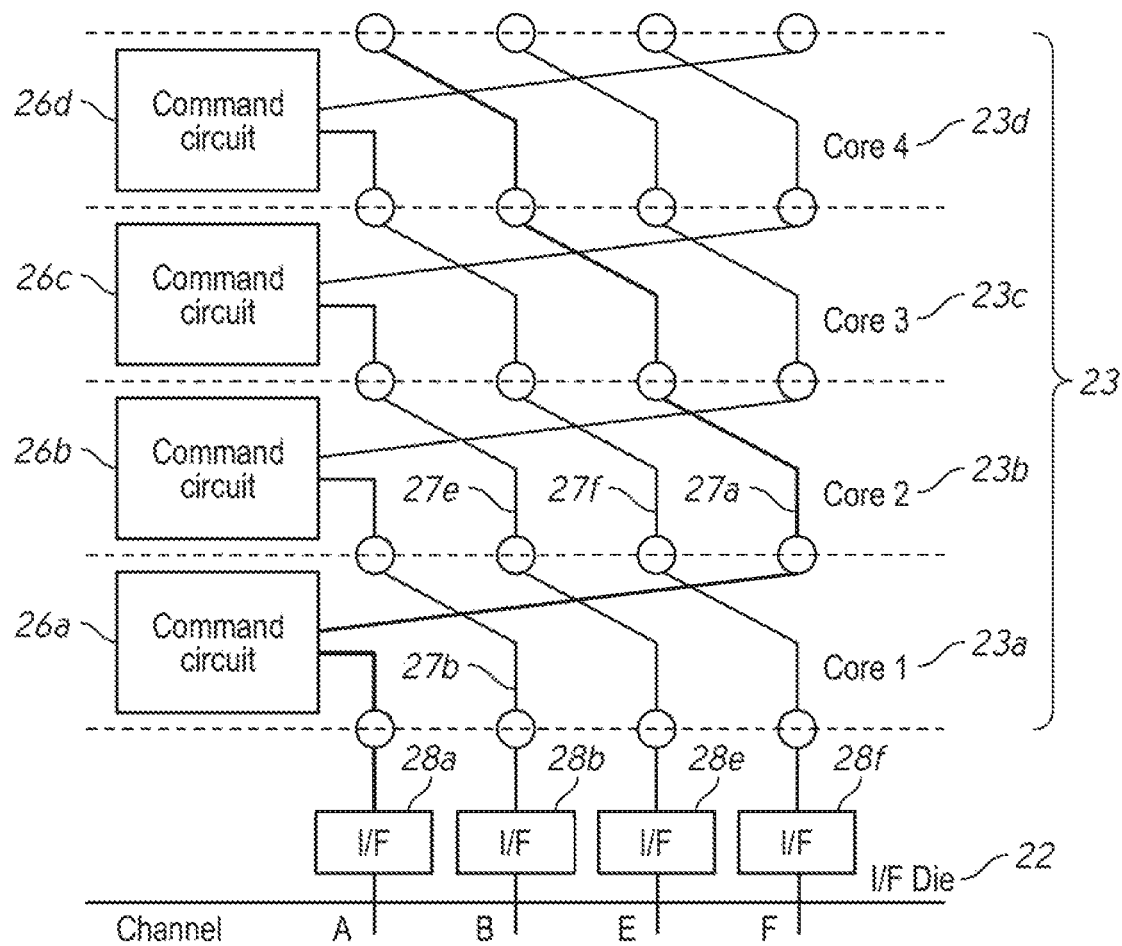
FIG. 4A is a wiring diagram of the memory device stack of FIG. 2A including an I/F die and a plurality of core dies.

FIG. 4A is a wiring diagram of the memory device stack 21 including the I/F die 22 and the plurality of core dies 23. The I/F die 22 of the memory device 21 provides interfaces 28a, 28b, 28e and 28f which provide signals on four input/output channels among the eight input/output channels, which function independently of each other. Memory arrays of the Channel A, Channel B, Channel E and Channel F of the core dies 23a, 23b, 23c and 23d may be coupled to the I/F die 22 via native input output lines (IOs) 27a, 27b, 27e and 27f, respectively. For example, the native IOs 27a to 27f may be implemented as conductive vias. For example, the conductive vias may have a spiral structure. Each core die 23 may include a command circuit for each channel. For example, the core dies 23a to 23d may include command circuits 26a to 26d for Channel A, Channel B, Channel E and Channel F, respectively. Thus, clock signals, command signals and data signals for each channel may be transmitted independently and a plurality of data buses and their respective channels can operate individually.

FIG. 3A is a schematic diagram of a memory device stack 31 that may also be the memory device 1 of FIG. 1, including an interface (I/F) die 32 and a plurality of memory core dies 33 such as DRAM dies according to an embodiment of the disclosure. The core dies 33 may be stacked with one another. For example, plurality of core dies 33 in the memory device stack 31 are stacked and may include eight core dies. FIG. 3B is a schematic diagram of the memory device stack 31 including the I/F die 32 and the plurality of core dies 33 according to an embodiment of the disclosure. The memory device stack 31 may have two 128-bit channels per core die for a total of eight input/output channels and a width of 1024 bits in total. For example, each core die of the plurality of the core dies 33 may include two channels. The memory device stack 31 may be logically divided into multiple stack groups. In this example, a stack group 34a having a stack identifier (SID) "0" includes the core dies 33a, 33b, 33c and 33d including Channels A and C, Channels B and D, Channels E and G, and Channels F and H, respectively. A stack group 34b having a stack ID (SID) "1" includes the core dies 33e, 33f, 33g and 33h including Channels A and C, Channels B and D, Channels E and G, and Channels F and H, respectively. Thus, a destination dies among a plurality of core dies in each channel (e.g., core dies 33a and 33e of Channel A) addressed in a command may be identified by the SID. The core dies 33a, 33b, 33c, and 33d may represent a "stack" and the core dies 33c, 33f, 33g, and 33h may represent another stack that is stacked on the stack of core dies 33a, 33b, 33c, and 33d.

Figure 4B:
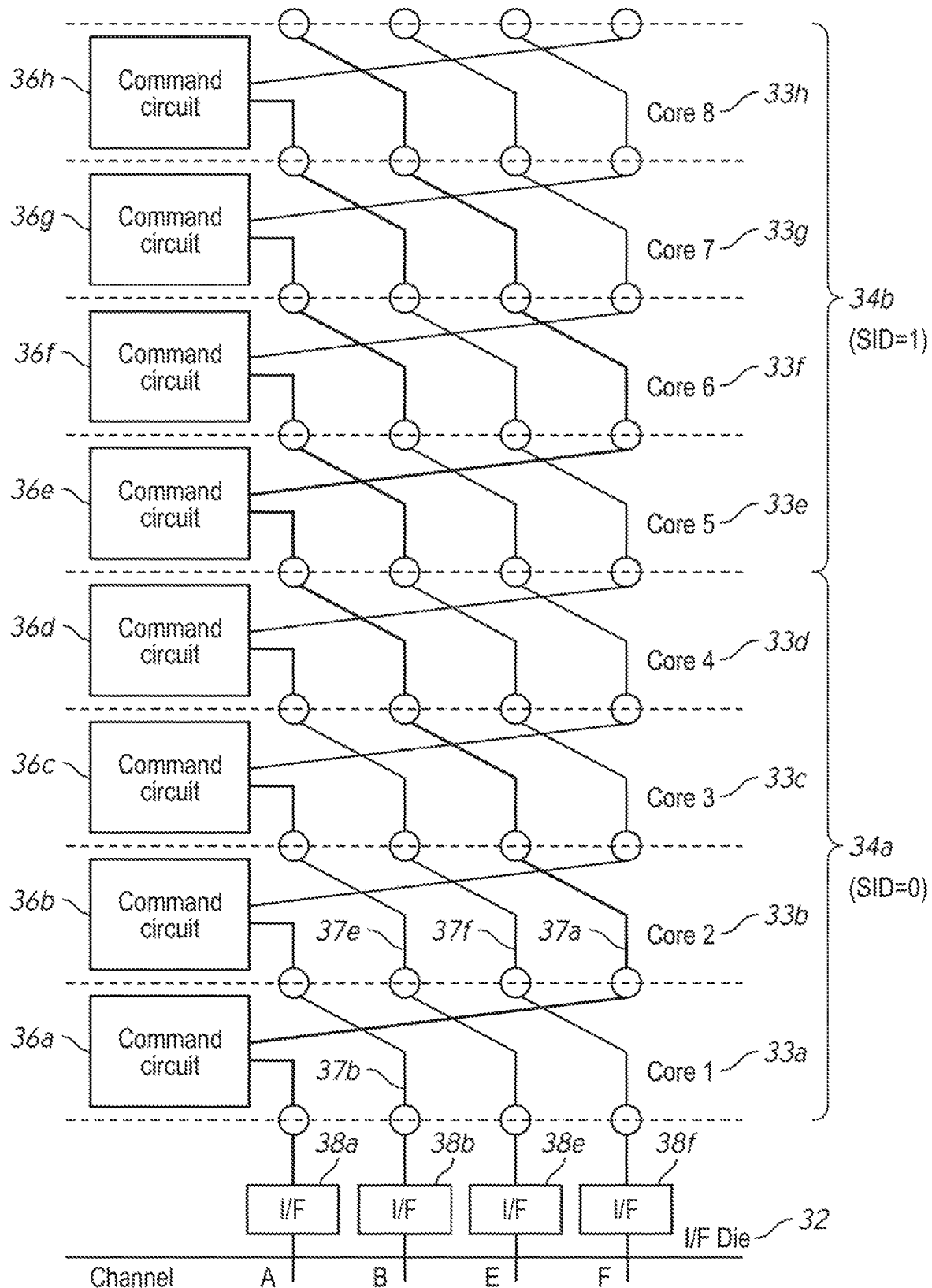
FIG. 4B is a wiring diagram of the memory device stack of FIG. 3A including an I/F die and a plurality of core dies according to an embodiment of the disclosure.

FIG. 4B is a wiring diagram of the memory device stack 31 including the I/F die 32 and the plurality of core dies 33 according to an embodiment of the disclosure. The I/F die 32 of the memory device 31 provides interlaces 38a, 38b, 38e and 38f which provide signals on four input/output channels among the eight input/output channels of two stack groups. Memory arrays of Channels A, B, E and F of the stack group 34a and memory arrays of Channels A, B, E and F of the stack group 34b may be coupled to the same native input/output lines (IOs) 37a, 37b, 37e and 37f respectively. For example, memory arrays of Channel A of the core die 33a in the stack group 34a and memory arrays of Channel A of the core die 33e in the slack group 34b may be coupled to the native IO 37a. Each core die 33 may include a command circuit for each channel. For example, the core dies 33a to 33d in the stack group 34a may include command circuits 36a to 36d for Channel A, Channel B, Channel E and Channel F, respectively. The core dies 33e to 33h in the stack group 34b may include command circuits 36e to 36h for Channel A, Channel B, Channel E and Channel F, respectively. Each command circuit 36 may detect the SID in a command, check whether the SID in the command matches with an SID of the stack group of the core dies 33 including the command circuit 36, and decode the command if the SID matches and memory access actions responsive to the command may be performed. For example, when the interface 38a transmits a command on the input output line 37a, the command circuit 36a receives the command and check whether the SID in the command is "0". The command circuit 36a processes the command if the SID is "0" and ignores the command if the SID is "1". The command circuit 36e also receives die command and check whether the SID in the command is "1". The command circuit 36e processes the command if the SID is "1" and ignores the command if the SID is "0". Thus, clock signals, command signals and data signals tor each channel on each die may be transmitted independently.

Figure 5:
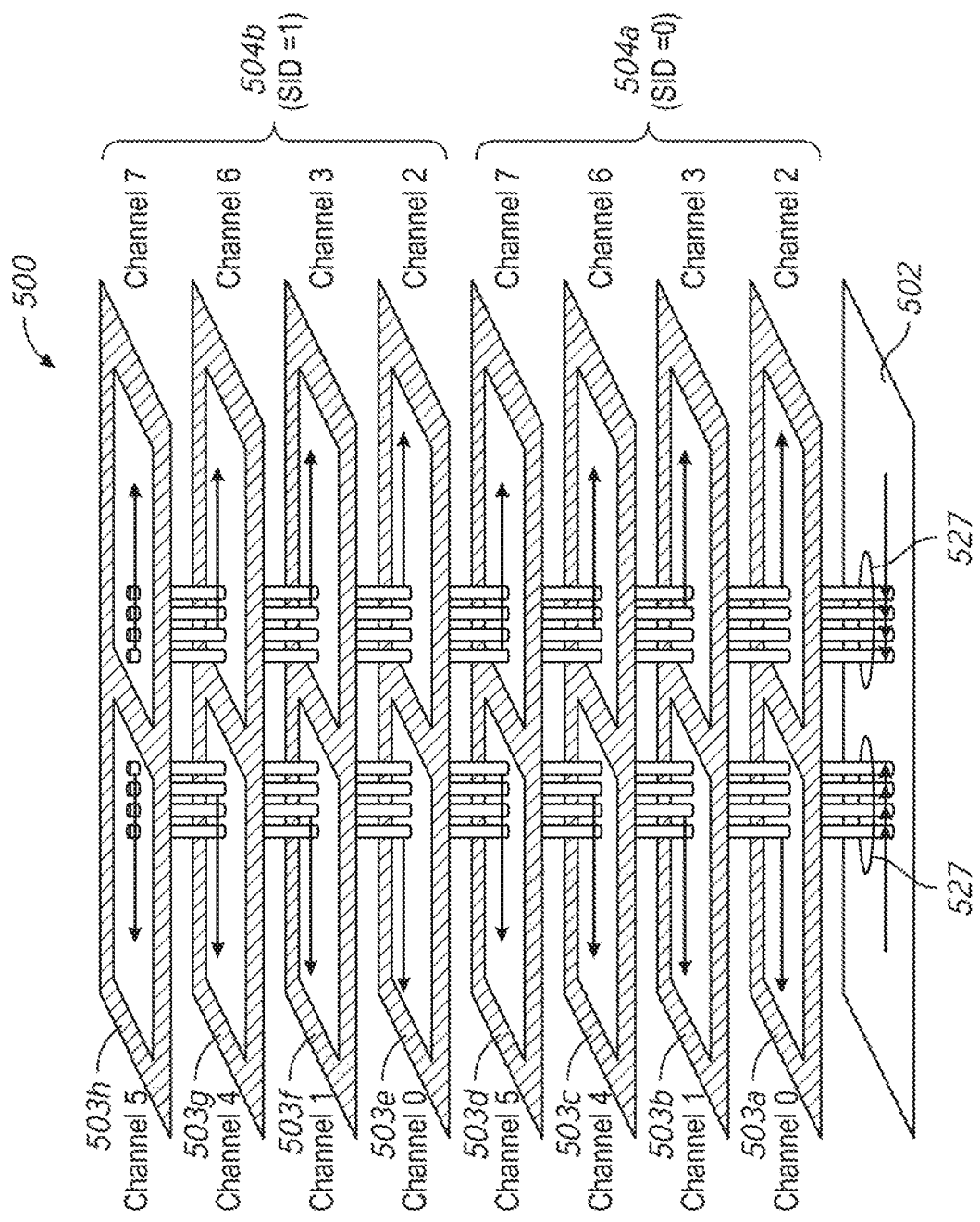
FIG. 5 is a block diagram of a memory device according to an embodiment of the disclosure.

FIG. 5 is a block diagram of a memory device 500 according to an embodiment of the disclosure. The memory device 500 may be a memory device stack in some embodiments of the disclosure. The memory device 500 includes an interface (I/F) die 502 and a plurality of core dies 503. Each of the core dies 503 may be a memory die including a memory array for storing data and further including circuits tor performing memory operations. The memory device 500 is shown in FIG. 5 as including eight core dies 503a-503h. However, greater or fewer core dies may be included in other embodiments of the disclosure.

The memory device 500 may have multiple channels. For example, each core die 503 of the memory device 500 may include two channels. In the embodiment of FIG. 5, the core die 503a includes Channels 0 and 2, the core die 503b includes Channels 1 and 3, the core die 503c includes Channels 4 and 6, and the core die 503d includes Channels 5 and 7. Additionally, the core die 503e includes Channels 0 and 2, the core die 503f includes Channels 1 and 3, the core die 503g includes Channels 4 and 6, and the core die 503h includes Channels 5 and 7.

The Channels 0-7 are coupled to the interface die 502 through signal lines 527. In the embodiment of FIG. 5, four sets of Signal lines are provided for Channels 0, 1, 4, and 5 and another four sets of signal lines are provided for Channels 2, 3, 6, and 7. Each set of signal lines may provide signals between the interface die 502 and a respective channel. For example, one set of signal lines may provide signals between the interface die 502 and Channel 0 of core dies 503a and 503e, another set of signal lines may provide signals between the interface die 502 and Channel 1 of core dies 503b and 503f, and so on, for the other channels. The signal lines 527 may include conductive vias, for example, through-silicon (or through-substrate) vias (TSVs).

The core dies 503 are logically arranged into two stack groups. For example, a stack group 504a having a stack identifier (SID) "0" includes the core dies 503a, 503b, 503c, and 503d, and includes Channels 0 and 2, 1 and 3, 4 and 6, and 5 and 7, respectively. The stack group 504a may be referred to as a "master" stack group. A stack group 504b having a stack ID (SID) "1" includes the core dies core dies 503e, 503f, 503g, and 503h, and includes Channels 0 and 2, 1 and 3, 4 and 6, and 5 and 7, respectively. The stack group 504b may be referred to as a "slave" stack group. Each stack group 504a and 504b includes eight channels (e.g., Channels 0-7). Memory locations associated with one of the eight channels included in each of the stack groups 504a and 504b may be accessed by identifying the stack group with the SID along with an address for the memory locations.

In Operation, memory commands and addresses are provided to the interface die 502 from a (graphic) processor or a memory controller (see FIG. 1). The commands and addresses are then provided to the core dies 503 over the signal lines. The core dies 503 provide data over the signal lines 527 to the interface die 502 for read commands and the core dies 503 are provided with data over the signal lines 527 by the interface die 503 for write commands.

One or more channels of the memory device 500 may be or become inoperable (e.g., defective). The entire memory device 500 may be inoperable because of the one or more inoperable channels.

Figure 6:
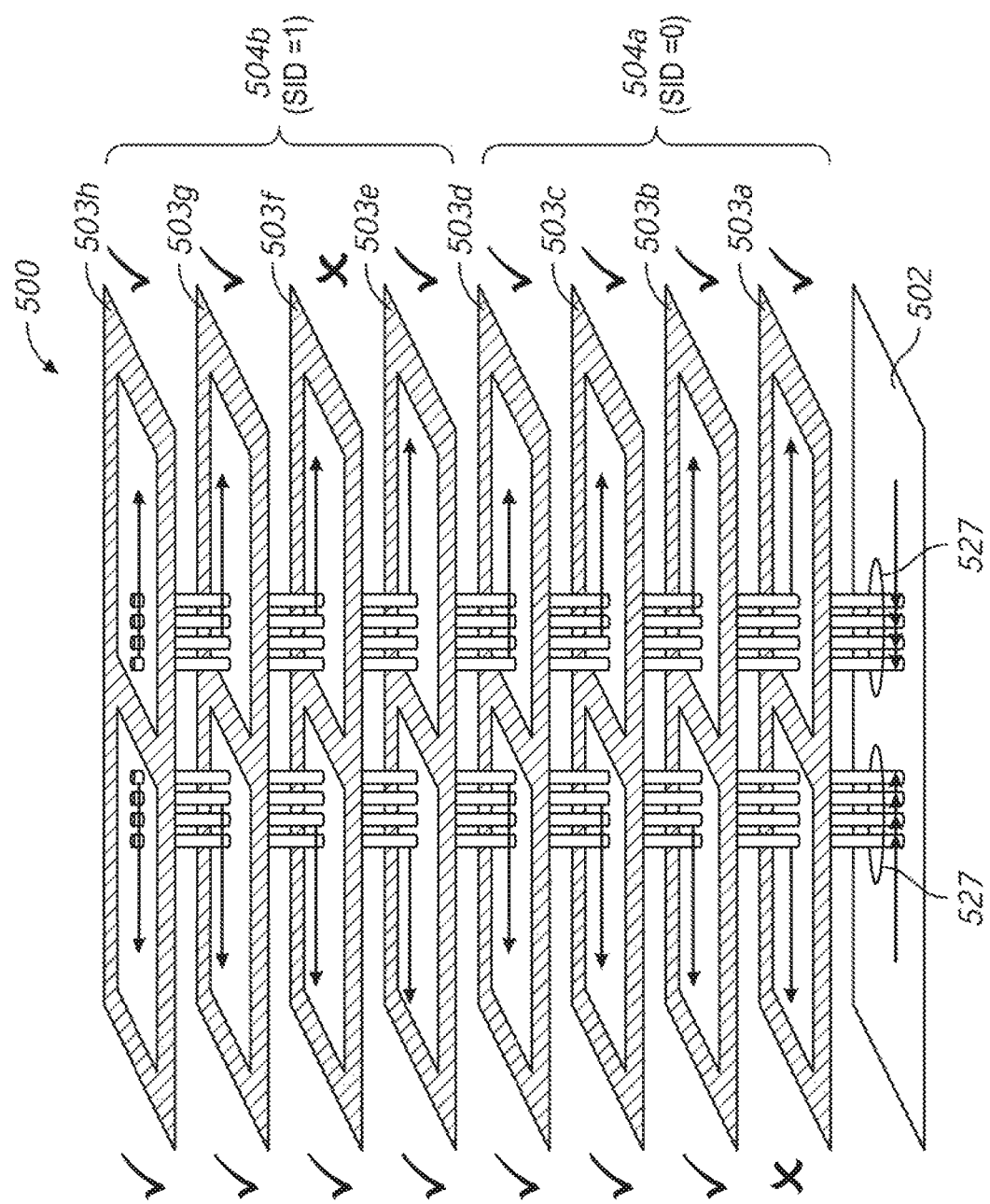
FIG. 6 is a block diagram of the memory device of FIG. 5 having two inoperable channels.

FIG. 6 is a block diagram of the memory device 500 having two inoperable channels. A first inoperable channel is Channel 0 of core die 503a, which is included in slack group 504a and a second inoperable is Channel 3 of core die 503f, which is included in stack group 504b. Both inoperable channels are identified in FIG. 6 by the "X" next to the respective channel. All the remaining channels are operable. Rather than the entire memory device 500 being inoperable for having an inoperable channel in both stack groups 504a and 504b, as will be described below, the memory device 500 includes circuits for replacing an inoperable channel of one stack group with an operable channel of another stack group. The inoperable channel of one stack group may be replaced by accessing the operable channel of the other stack group instead of accessing the inoperable channel. The resulting memory device 500 may be used as a single stack group memory device having eight operable channels. While the memory capacity of the resulting memory device 500 is less than if all the channels for both stack groups 504a and 504b are operable, the resulting memory device may nonetheless be operable as a reduced memory capacity memory device.

Figure 7:
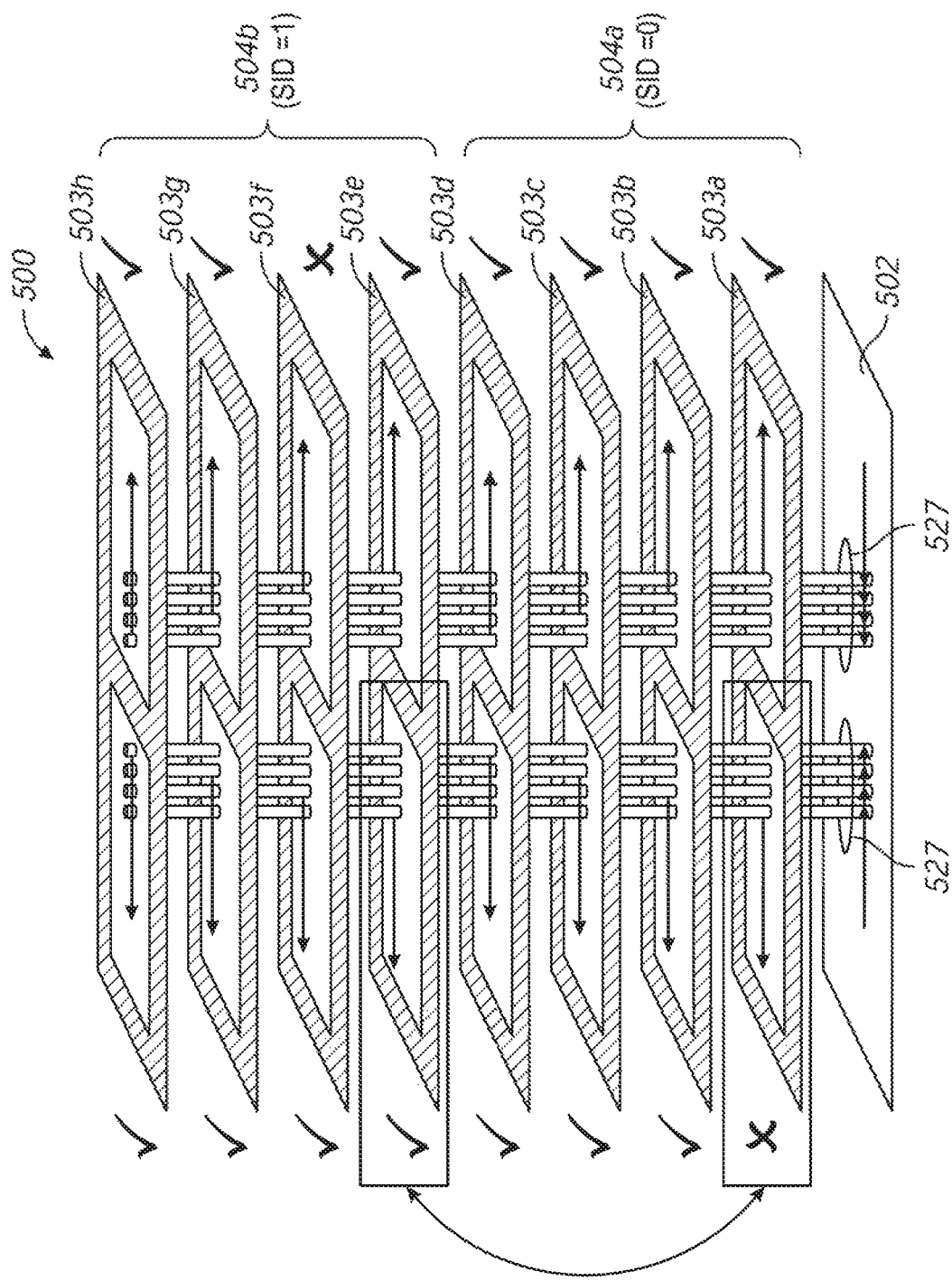
FIG. 7 is a block diagram of the memory device of FIG. 5 having the two inoperable channels of FIG. 6 and showing an operable channel of one stack group replacing an inoperable channel of another stack group according to an embodiment of the disclosure.

FIG. 7 is a block diagram of the memory device 500 having the two inoperable channels of FIG. 6 and showing an operable channel of one stack group replacing an inoperable channel of another stack group according to an embodiment of the disclosure. As shown in FIG. 7, the inoperable Channel 0 of stack group 504a is replaced by the operable Channel 0 of stack group 504b. Instead of accessing the inoperable Channel 0 of stack group 504a, the operable Channel 0 of stack group 504b is accessed. All the other (i.e., operable) channels of stack group 504a are accessed normally. As a result, the memory device 500 may be used as an eight channel memory device with a single stack group.

Figure 8:
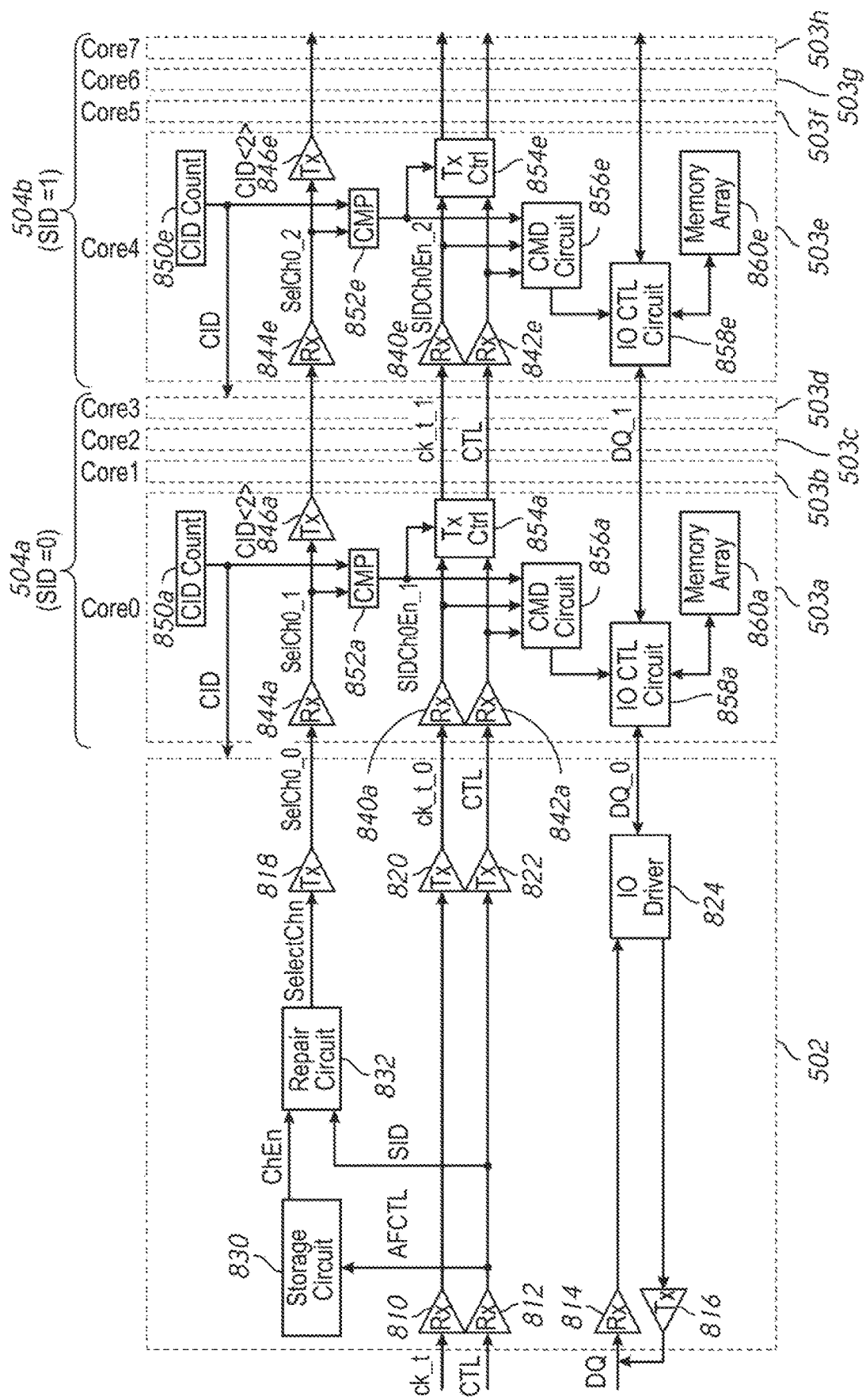
FIG. 8 is a schematic diagram of circuits included in the memory device of FIG. 5 according to an embodiment of the disclosure.

FIG. 8 is a schematic diagram of circuits included in the interface die 502 and core dies 503a-503h of the memory device 500 according to an embodiment of the disclosure. Each of the core dies 503a-503h may be a memory die including memory for storing data and further including circuits for performing memory operations. The core dies 503a-503h are arranged in two stack groups 504a and 504b. Stack group 504a includes core dies 503a-503d and slack group 504b includes core dies 503e-503h. FIG. 8 shows details of a channel for core die 503a of stack group 504a and for core die 503e of stack group 504b. Some or all of the circuits shown and described below with respect to the core dies may be replicated and/or combined for additional channels included in a core die. Moreover, each of the other core dies 503b-503d and 503f-503h of the memory device 500 may include the same or similar circuits as shown in FIG. 8 for core dies 503a and 503e.

The interface die 502 includes receiver circuits 810, 812, and 814. The receiver circuit 810 receives a clock signal ck_t and provides the ck_t signal to a transmitter circuit 820. The ck_t signal may be used for timing various memory operations, for example memory access operations. The receiver circuit 812 receives control signals CTL. The CTL signals may include various commands for performing various memory operations. For example, the CTL signals may include memory access commands such as read commands, write commands, etc. to be performed by the core dies 503a-503h. The CTL signals may also include commands, as represented by AFCTL, for programming storage circuit elements included in storage circuit 830 (which may also be referred to as a defective information store circuit).

The storage circuit elements of the storage circuit 830 may be programmed in response to the AFCTL command to store, for example, information related to the operability of each channel of the core dies 503a-503h (e.g., defective information for the channel of the core dies 503a-503h). The storage circuit elements of the storage circuit 830 may include non-volatile memory that will continue to store the information even when power is not provided. The storage circuit elements of the storage circuit 830 may be antifuse circuits in some embodiments of the disclosure. The information related to the operability of each channel of the core dies 503a-503h may be determined by product testing during the manufacture of the memory device 500, and the information programmed in response to the AFCTL command, which may be provided by a memory tester.

The storage circuit 830 provides signals ChEn (which may also be referred to as defective signals) to a repair circuit 832. The ChEn signals may be based on the information stored in the storage circuit 830. For example, the ChEn signals provided by the storage circuit 830 may indicate which channels of the core dies 503a-503h are operable (or inoperable). For example, a first logic level of the ChEn signal may indicate that the respective channel is operable and a second logic level of the ChEn signal may indicate that the respective channel is inoperable. The ChEn signals include a respective signal for each channel of the memory device 500. For example, in the embodiment of FIG. 8, where the memory device 500 includes 8 channels and two stack groups, each of the 8 channels for both of the two stack groups has a respective ChEn signal. Each of the ChEn signals may indicate whether the respective channel is operable.

The receiver circuit 814 receives data DQ and provides the data DQ to an input-output (IO) driver circuit 824. The data DQ received by the receiver circuit 814 may be write data to be stored in memory of the core dies 503a-503h associated with a write operation. The transmitter circuit 816 provides data DQ from the IO driver circuit 824. The data provided by the transmitter circuit 816 may be read data from the memory of the core dies 503a-503h associated with a read operation.

The CTL signals may also include, for example, stack identification (SID) information related to a memory access operation. The SID information may indicate the stack group and channel associated with the memory access operation. The SID information may be provided to the repair circuit 832. As will be described in more detail below, the SID information may be compared by the repair circuit 832 to the information stored in the storage circuit 830 in order to determine whether to access a channel of the stack group corresponding to the SID information, or to access a corresponding channel of an alternative stack group, such as when the channel of the stack group corresponding to the SID information is inoperable.

The repair circuit 832 provides channel select signals SelectChn based on the comparison of the SID information and the information stored in the storage circuit 830. The channel select signals SelectChn include a respective channel select signal for each of the channels. An active channel select signal selects the corresponding channel for a memory operation. For example, where each of the stack groups include eight channels, the repair circuit 832 provides eight select signals to the core dies 503a-503h. A logic level of the respective select signal will select the corresponding channel of the core dies 503a-503h for a memory operation. For example, a first logic level of the respective channel select signal may select a first stack group and a second logic level of the respective select signal may select a second stack group. The channel select signals SelectChn are provided by the repair circuit 832 through transmitter circuit 818 to the core dies 503a-503h.

As previously described, the core dies 503a-503h are coupled to the interface die 502 through signal lines. The signal lines may include conductive vias (or TSVs). In some embodiments of the disclosure, the conductive vias may have a spiral structure. Each of the core dies 503a-503h includes a receiver circuit 840 that receives a clock signal ck_t and further includes a receiver circuit 842 that receives the control signals CTL The receiver circuits 840 and 842 provide the ck_t signal and the CTL signals to a transmitter control circuit 854. The transmitter control circuit 854 provides the ck_t and CTL signals to other core dies of the core dies 503a-503h when activated and does not provide the ck_t and CTL signals to other core dies of the core dies 503a-503h when not activated. The receiver circuit 840 also provides the ck_t signal and the CTL signals to a command circuit 856.

A control circuit 858 controls various memory circuits to perform operations for a memory command when activated by the command circuit 856. The control circuit 858 may also receive and provide data DQ, for example, receiving write data to be written to memory array 860, or providing read data from the memory array 860. The data DQ may be received from the IO driver 824 of the interface die 502, or from the control circuit 858 of other core dies of the core dies 503a-503h. The control circuit 858 may be controlled by the command circuit 856. The command circuit 856 may control the control circuit 858 based on the ck_t signal front the receiver circuit 840 and on the CTL signals from the receiver circuit 842a.

The core dies 503a-503h further include a receiver circuit 844 that receives a respective channel select signal SelectChn from the interface die 502 and provides the channel select signal to a transmitter circuit 846 and a comparison circuit 852. The transmitter circuit 846 provides the channel select signal to other core dies of the core dies 503a-503h that include a corresponding channel. The comparison circuit 852 compares the channel select signal with a respective chip identification (CID) count, or portion of a multibit CID count. In some embodiments of the disclosure, for example, as shown in FIG. 8, the most significant bit of the CID count (e.g., CID<2> of a three bit CID count) may be compared by the comparison circuit 852 with the channel select signal.

The comparison circuit 852 of a core chip compares the respective SelectChn signal with CID<2> to detect selection of that core chip for a memory access operation. The comparison circuit 852 provides an active SIDChnEn signal (e.g., active high logic level) when the core chip is selected and provides an inactive SIDChnEn signal (e.g., inactive low-logic level) when the core chip is not selected. The SIDChnEn signal is provided to the transmitter control circuit 854 and the command circuit 856. An active SIDChnEn signal activates the command circuit 856 to perform memory operations and does not activate the transmitter control circuit 854, whereas an inactive SIDChnEn signal does not activate the command circuit 856 but activates the transmitter control circuit 854. As a result, memory operations are not performed by the core die, although the clock signal ck_t and CTL signals are provided to the other core die.

The CID count (or portion of the CID count) is provided by a CID counter circuit 850. The CID counter circuit 850 of a core die provides a CID count that is associated with that core die. For example, the CID counter circuit of all the core dies 503a-503h may be reset to an initial value when reset (e.g., power up, reset operation, etc.) and decremented (or incremented in some embodiments) for each of the core dies 503a-503h in the memory device 500. For example, the CID counter circuits 850 of the core dies 503a-503h may be reset to the highest count (or the lowest count). The highest count may be 111 for a three-bit count CID<2:0> (the lowest count may be 000 for a three-bit count CID<2:0>). The CID count is decremented (or incremented) by one for each succeeding lower core die in the memory device 500. As a result, the uppermost core die 503h of the memory device 500 may have CID<2:0>=111 (or 000), the next lower core die 503g of the memory device 500 may have CID<2:0>=110 (or 001), the next lower core die 503f of the memory device 500 may have a CID<2:0>=101 (or 010), and so on until the lowermost core die 503a of the memory device 500 has a CID<2:0>=000 (or 111). The most significant bit of the CID<2:0> count for a core die, that is, CID<2>, has a value that represents the SID of the stack group in which that core die is included. For example, with reference to the memory device 500, the four uppermost core die 503e-503h all have a CID<2> value=1 (or 0), representing an SID=1 (or 0) for the stack group 504b, and the four lowermost core die 503a-503d all have a CID<2> value=0 (or 1), representing an SID=0 (or 1) for the stack group 504a.

In operation, a memory command is included in the CTL signal provided to the interface die 502. Associated with the memory command is SID information identifying the stack group and channel to which the memory command is directed. For example, the SID associated with a read command identifies the stack group from which data is read, and the SID associated with a write command identifies the stack group to which data is written. The repair circuit 832 compares the SID information with the ChEn signals from the storage circuit 830. As previously described, the ChEn signals may indicate which channels of the core dies 503a-503h are operable. The repair circuit 832 provides respective channel select signals SelectChn to the core dies 503a-503h to select the channel of the core die identified by the SID information.

Based on the ChEn signals, the repair circuit 832 provides the SelectChn signals to select the channel of the core die of the stack group actually corresponding to the SID information, or to select the same channel of a core die of another stack group, such as when the channel of the core die of the stack group that actually corresponds to the SID information is inoperable.

For the purpose of providing a non-limiting example, it is assumed that Channel 0 of core die 503a is operable, as indicated by information stored in the storage circuit 830 for Channel 0 of core die 503a, and that a memory command is directed to memory of Channel 0 of stack group 504a (i.e., core die 503a including Channel 0 will be accessed), as indicated by the SID information.

The SID information is provided to the repair circuit 832 and compared to the information from the storage circuit 830 as represented by the ChEn signal. With the information from the storage circuit 830 indicating that Channel 0 of stack group 504a is operable, the repair circuit 832 provides a channel select signal SelectCh0 to select Channel 0 of stack group 504a for access. In the present example, SelectCh0=0 for this condition.

The SelectCh0 signal is provided by the transmitter circuit 818 to core die 503a of stack group 504a and to core die 503e of stack group 504b. As previously described, in some embodiments of the disclosure, signals may be provided to corresponding core dies of different stack groups through conductive vias having a spiral structure, for example, as previously described with reference to FIG. 4B Returning to FIG. 8, the receiver circuit 844a of the core die 503a provides the SelCh0_0 signal as a SelCh0_1 signal to the comparison circuit 852a and to the transmitter circuit 846a. The transmitter circuit 846a provides the SelCh0_1 signal to the core die 503e. The core die 503e includes Channel 0 for stack group 504b. A receiver circuit 844e provides the SelCh0_2 to the comparison circuit 852e and to the transmitter circuit 846e. The SelCh0_1 and SelCh0_2 signals have the same logic level as the SelCh0_0 signal provided by the transmitter circuit 818 of the interface die 502.

The comparison circuit 852a (of core die 503a) compares the SelCh0_1 signal to the CID<2> value from the CID counter circuit 850a and the comparison circuit 852e (of core die 503e) compares the SelCh0_2 signal to the CID<2> value from the CID counter circuit 850e. As previously described, the CID<2> value from the CID counter circuit 850a is 0 representing an SID=0 for the stack group 504a and the CID<2> value from the CID counter circuit 850e is 1 representing an SID=1 for the stack group 504b. The comparison circuit 852a identifies a match between SelCh0_1 signal and its respective CID<2> value (both are 0) and the comparison circuit 852e does not identify a match between SelCh0_2 and its respective CID<2> (the SelCh0_2 signal is 0 and the CID<2> value for core die 503e is 1).

The comparison circuit 852a provides an active SIDCh0En_1 signal to activate the command circuit 856a to respond to the memory command included in the CTL signals and to the clock signal ck_t. The active SIDCh0En_1 signal does not activate the transmitter control circuit 854a to prevent the ck_t signal and the CTL signals from being provided to the core die 503c. The activated command circuit 856a provides signals to the circuits of the core die 503a to perform operations for the memory command, for example, the control circuit 858a may be activated by the command circuit 856a to control execution of the operation. In contrast, the comparison circuit 852e provides an inactive SIDCh0En_2 signal so that the command circuit 856e remains inactive and the core die 503e is not accessed.

For the purpose of providing another non-limiting example, it is assumed that Channel 0 of core die 503a is inoperable but Channel 0 of core die 503e is operable, as indicated by the information stored in the storage circuit 830 for Channel 0 of core dies 503a and 503e, and it is further assumed that a memory command is directed to memory of Channel 0 of stack group 504a, as indicated by the SID information.

The SID information is provided to the repair circuit 832 and compared to the information from the storage circuit 830 as represented by the ChEn signal. With the information from the storage circuit 830 indicating that Channel 90 of stack group 504a (core die 503a) is inoperable but Channel 0 of stack group 504b (core die 503e) is operable, the repair circuit 832 provides a channel select signal SelectCh0 to select Channel 0 of stack group 504b for access. In the present example, SelectCh0=1 for this condition. Thus, by repairing the inoperable Channel 0 of stack group 504a by replacing it with the operable Channel 0 of stack group 504b, the memory device 500 may nonetheless be operable as a memory device with lesser memory capacity.

The SelectCh0 signal is provided by the transmitter circuit 818 to core die 503a of stack group 504a and to core die 503e of stack group 504b. The receiver circuit 844a of the core die 503a provides the SelCh0_0 signal as a SelCh0_1 signal to the comparison circuit 852a and to the transmitter circuit 846a. The transmitter circuit 846a provides the SelCh0_1 signal to the core die 503e. The core die 503e includes Channel 0 for stack group 504b. A receiver circuit 844e provides the SelCh0_2 to the comparison circuit 852e and to the transmitter circuit 846e. As previously described, the SelCh0_1 and SelCh0_2 signals have the same logic level as the SelCh0_0 signal provided by the transmitter circuit 818 of the interface die 502.

The comparison circuit 852a (of core die 503a) compares the SelCh0_0 signal to the CID<2> value from the CID counter circuit 850a and the comparison circuit 852e (or core die 503e) compares the SelCh0_2 signal to the CID<2> value from the CID counter circuit 850e. As previously described, the CID<2> value from the CID counter circuit 850a is 0 representing an SID=0 for the stack group 504a and the CID<2> value from the CID counter circuit 850e is 1 representing an SID=1 for the stack group 504b.

The comparison circuit 852a does not identify a match between the SelCh0_1 signal and its respective CID<2> value (the SelCh0_1 signal is 1 and the CID<2> value for core die 503a is 0) and the comparison circuit 852e identifies a match between SelCh0_2 and its respective CID<2> value (both are 1).

The comparison circuit 852a provides an inactive SIDCh0En_1 signal so that the command circuit 856a remains inactive and the core die 503a is not accessed. The transmitter circuit 854a is active because of the inactive SIDCh0En_1 signal, and provides to the core die 503e the CTL signals and the clock signal ck_t_0 as the ck_t_1 signal. In contrast, the comparison circuit 852e provides an active SIDCh0En_2 signal to activate the command circuit 856e to respond to the memory command included in the CTL signals and to the clock signal ck_t_1 provided by the core die 503a. The active SIDCh0En_2 signal additionally disables the transmitter control circuit 854e to prevent the ck_t_1 signal and the CTL signals from being provided to any other core dies. The activated command circuit 856e provides signals to the circuits of the core die 503e to perform operations for the memory command, for example, the control circuit 858e may be activated by the command circuit 856e to control execution of the operation.

Figure 9:
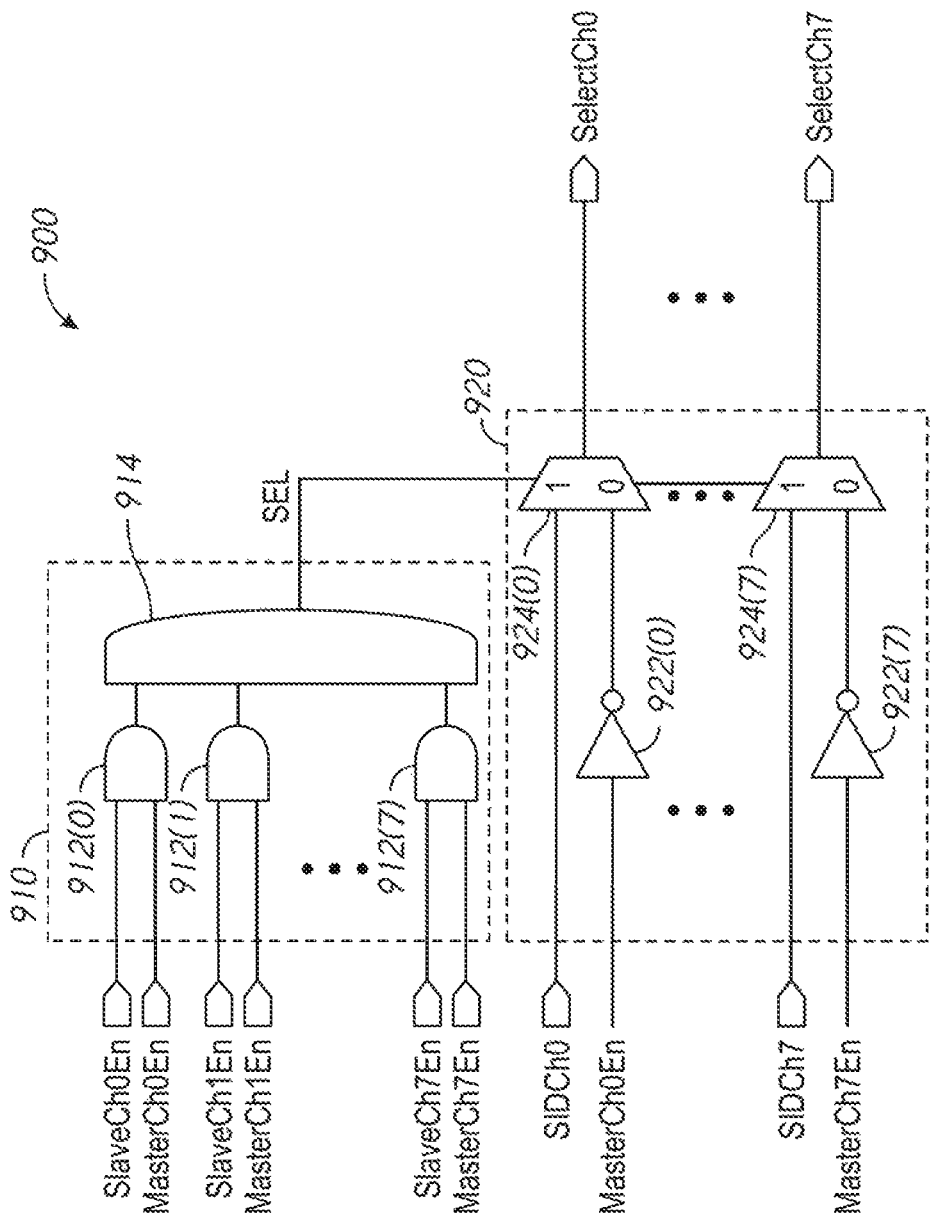
FIG. 9 is a schematic diagram of a repair circuit according to an embodiment of the disclosure.

FIG. 9 is a schematic diagram of a repair circuit 900 according to an embodiment of the disclosure. The repair circuit may be included in the repair circuit 832 of FIG. 8 in some embodiments of the disclosure.

The repair circuit 900 includes a channel selection control circuit 910 and a channel selection circuit 920. The channel selection control circuit 910 includes logic circuits 912(0)-912(7). Each logic circuit 912(0)-912(7) corresponds to a channel of a multi-channel memory device, and receives respective enable signals MasterChnEn and SlaveChnEn. In some embodiments, the MasterChnEn and SlaveChnEn signals are provided from a storage circuit as the ChEn signals, for example, as shown in FIG. 8.

The MasterChnEn signal has a logic level that indicates whether the corresponding channel in the master stack group is operational, and the SlaveChnEn signal has a logic level that indicates whether the corresponding channel in the master stack group is operational. For example, with reference to memory device 500, the MasterCh0En signal has a high logic level (e.g., logic level "1") when Channel 0 of the stack group 504a is operable and has a low logic level (e.g., logic level "0") when Channel 0 of the stack group 504a is inoperable. Similarly, the SlaveCh0En signal has a high logic level (e.g., logic level "1") when Channel 0 of the stack group 504b is operable and has a low logic level (e.g., logic level "0") when Channel 0 of the stack group 504b is inoperable. Operability of Channels 1-7 for the stack groups 504a and 504b are also indicated in the same manner by the respective MasterChnEn and SlaveChnEn signals. The outputs of the logic circuits 912(0)-912(7) are provided to logic circuit 914. The logic circuit 914 performs a logic operation on the outputs of the logic gates 912(0)-912(7) and provide a control signal SEL to the channel selection circuit 920. The logic circuits 912(0)-912(7) and 914 of the channel selection control circuit 910 are shown as AND logic circuits in the embodiment of FIG. 9. However, different logic circuits and/or a different number of logic circuits may be used in other embodiments without departing from the scope of the disclosure.

The channel selection circuit 920 includes multiplexers 924(0)-924(7) (which may also be referred to as selector circuits) that receive at a first input respective stack identification (SID) information SIDChn and receive at a second input from a respective inverter 922(0)-922(7) the complement of respective MasterChnEn signal. With reference to FIG. 8, SIDChn may be included in the SID information provided by the CTL signals. The multiplexers 924(0)-924(7) provide respective channel select signals SelectCh0-SelectCh7 (collectively referred to as SelectChn). The multiplexers 924(0)-924(7) provide the SID information SIDChn or the complement of the MasterChnEn signal as the respective SelectChn signal based on the SEL signal from the channel selection control circuit 910. In particular, a high logic level SEL signal controls the multiplexers 924(0)-924(7) to provide the SID information as the respective SelectChn signals and a low logic level SEL signal controls the multiplexers 924(0)-924(7) to provide the MasterChnEn signal as the respective SelectChn signals.

In operation, the channel selection control circuit 910 provides a high logic level SEL signal when all of the channels of all of the stack groups are operable (i.e., all of the MasterChnEn and SlaveChnEn signals have a high logic level), but provides a low logic level SEL signal when any of the channels of either stack group are inoperable (i.e., any of the MasterChnEn and SlaveChnEn signals have a low logic level).

When all of the channels of a memory device are operable (i.e., all the MasterChnEn and SlaveChnEn signals have a high logic level), the multiplexers 924(0)-924(7) of the channel selection circuit 920 provide SIDChn as respective SelectChn signals. As previously described with reference to FIG. 8, the SelectChn signals are provided to the core dies 503a-503h where the value of the SelectChn signal is compared with respective CID value to determine whether to activate the corresponding channel for the stack group 504a or 504b. For example, when SIDCh0 is a low logic level, and SIDCh0-SIDCh7 are provided by the multiplexers 924(0)-924(7) as the SelectChn signals, the SelectCh0 signal will be a low logic level to activate Channel 0 of the stack group 504a. Conversely, when SIDCh0 is a high logic level, and SIDCh0-SIDCh7 are provided by the multiplexers 924(0)-924(7) as the SelectChn signals, the SelectCh0 signal will be a high logic level to activate Channel 0 of the stack group 504b.

When one or more of the channels of the memory device is inoperable (i.e., at least one of the MasterChnEn and SlaveChnEn signals have a low logic level), the multiplexers 924(0)-924(7) of the channel selection circuit 920 provide the complement of the MasterChnEn signals as respective SelectChn signals. As a result, the SelectChn signals for the channels of the memory device that are operable for the stack group 504a will have a low logic level. The SelectChn signals for the channels of the memory device that are inoperable for the stack group 504a will have a high logic level. The low logic level SelectChn signals for the operable channels of stack group 504a cause the activation of the corresponding core dies 503a-503h of the stack group 504a when the SID information provided to the memory device indicates selection of the stack group 504a. However, the high logic level SelectChn signals for the inoperable channels of stack group 504a cause the activation of the corresponding core dies 503a-503h of the stack group 504b instead when the SID information provided to the memory device indicates selection of the stack group 504a. In this manner, an inoperable channel of stack group 504a may be repaired by replacing it with an operable channel of stack group 504b, if available. Although such a memory device has inoperable channels and would not be operable as an 8 channel, two stack group memory device, the memory device may nonetheless be operable as an 8 channel, one stack group memory device.

An example of repairing an inoperable channel in stack group 504a will now be described with reference to FIGS. 7, 8, and 9. The example is not intended to limit the scope of the disclosure to the particular details of the example, and is provided to facilitate understanding of the operation according to some embodiments of the disclosure.

Referring to FIG. 7, Channel 0 of stack group 504a and Channel 3 of stack group 504b of the memory device 500 are inoperable, and the remaining channels of stack group 504a and 504b are operable. The operability of the channels of the memory device 500 may be determined during a testing phase, which may occur during manufacturing, and in some embodiments of the disclosure, also after manufacturing of the memory device. The identifications of the inoperable and operable channels are stored in the memory device, for example, with reference to FIG. 8, as information stored in the storage circuit 830 of the interface die 502.

As a result of inoperable Channel 0 of the stack group 504a and inoperable Channel 3 of stack group 504b, the memory device 500 is inoperable as an 8 channel, two stack group memory device. However, the memory device 500 may be repaired to be operable as an 8 channel, one stack group memory device by replacing inoperable Channel 0 of stack group 504a with operable Channel 0 of stack group 504b.

The inoperable Channel 0 of stack group 504a and inoperable Channel 3 of stack group 504b results in, with reference to FIG. 9, a MasterCh0En signal having a low logic level, a SlaveCh3En signal having a low logic level, and MasterChnEn and SlaveChnEn signals for the other channels of stack groups 504a and 504b have a high logic level. With specific reference to the MasterChnEn signals, the MasterCh0En signal is a low logic level and the MasterCh1En-MasterCh7 signals are a high logic level. The channel selection control circuit 910 provides a low logic level SEL signal, which controls the multiplexers 924(0)-924(7) of the channel selection circuit 920 to provide the complement of the MasterChnEn signals as respective SelectChn signals. As a result, the SelectCh0 signal is a high logic level and the SelectCh1-SelectCh7 signals are a low logic level when provided to the core dies of the memory device.

By providing the complement of the MasterChnEn signals as respective SelectChn signals, Channels 1-7 of the stack group 504a may be activated when the corresponding channel is selected by SID information received by the interface die 502, whereas when SID information received by the interface die 502 selects Channel 0, Channel 0 of the stack group 504b is activated instead of Channel 0 of the stack group 504a. As previously described, replacing an inoperable channel of stack group 504a with a corresponding operable channel of stack group 504b may allow the memory device to be operable as an 8 channel, one stack group memory device.

From the foregoing it will be appreciated that, although specific embodiments of the disclosure have been described herein for purposes of illustration, various modifications may lie made without deviating from the spirit and scope of the disclosure. Accordingly, the scope disclosure should not be limited any of the specific embodiments described herein.

What is claimed is:

1. An apparatus comprising:
    a first stack comprising a plurality of first dies stacked with one another, the plurality of first dies comprising a plurality of first channels;
    a second stack comprising a plurality of second dies stacked with one another, the second stack being stacked with the first stack, the plurality of second dies comprising a plurality of second channels, wherein each of the plurality of second channels corresponds to a respective channel in the plurality of first channels in the plurality of first dies; and
    a control circuit configured to, responsive to a command for accessing a channel in the plurality of first channels:
        access a channel in the plurality of second channels corresponding to the channel in the plurality of first channels in place of accessing the channel if the channel is defective; and
        access the channel in the plurality of first channels, otherwise.

2. The apparatus of claim 1, wherein each of the plurality of first channels is configured to receive a same control signal as a corresponding one of the plurality of second channels.

3. The apparatus of claim 1, further comprising a defective information store circuit coupled to the control circuit and configured to store defective information that indicates whether at least one of the plurality of first channels and the plurality of second channels is defective or not, and wherein the control circuit is further configured to receive the defective information.

4. The apparatus of claim 3, wherein the defective information comprises a plurality of first defective signals corresponding respectively to the plurality of first channels and a plurality of second defective signals corresponding respectively to the plurality of second channels, the control circuit is further configured to receive a plurality of stack ID signals each of which designates a respective one of the first and second dies, and the control circuit comprises:
    a plurality of first logic circuits each of which is configured to receive a respective one of the first defective signals and a respective one of the second defective signals and provide a first output signal;
    a second logic circuit coupled to the first logic circuit and configured to receive the first output signals of the first logic circuit and provide a second output signal in response, at least in part to, the first output signals; and
    a plurality of selector circuits coupled to the second logic circuit, each of the selector circuits is configured to receive a respective stack ID signal and a respective first defective signal and output one of the respective stack ID signal and the respective first defective signal in response to the second output signal.

5. The apparatus of claim 1, wherein each of the first dies comprises corresponding two of the plurality of first channels and each of the second dies comprises corresponding two of the plurality of second channels.

6. The apparatus of claim 1, further includes a third die stacked with the first dies and the second dies and wherein the control circuit is formed in the third die.

7. The apparatus of claim 1, wherein each of the plurality of first channels and the plurality of second channels comprises:
    a chip identification counter circuit configured to provide a respective chip identification count;
    a comparison circuit configured to compare the respective chip identification count to a respective select signal from the control circuit, and further configured to provide an active activation signal responsive to a match between the respective chip identification count and the respective select signal and to provide an inactive activation signal responsive to no match between the respective chip identification count and the respective select signal; and
    a command circuit configured to perform memory operations responsive to the active activation signal and to be inactive responsive to the inactive activation signal.

8. The apparatus of claim 7, wherein each of the plurality of first channels and the plurality of second channels further comprises a transmitter control circuit configured provide a clock signal and control signals to the corresponding channel of the plurality of second channels or the plurality of first channels when activated by the inactive activation signal and configured to not provide the clock signal and the control signals to the corresponding channel of the plurality of second channels or the plurality of first channels when not activated by the active activation signal.

9. An apparatus, comprising:
    an interface die coupled to a first plurality of memory devices and a second plurality of memory devices, each of the first plurality of memory devices corresponding to a memory of the second plurality of memory devices, the interface die is configured to access respective memory of the first and second plurality of memory devices responsive to memory commands, the interface die including:
- a storage circuit configured to store information that indicates operability of respective memory of the first and second plurality of memory devices;
- a repair circuit configured to receive the information stored in the storage circuit and to provide a select signal to activate a memory of the first plurality of memory devices to be accessed responsive to a memory command to access a memory of the second plurality of memory devices when the information indicates that the memory of the second plurality of memory devices is inoperable.

10. The apparatus of claim 9, wherein the first plurality of memory devices are disposed in a first group of stacked dies and the second plurality of memory devices are disposed in a second group of stacked dies.

11. The apparatus of claim 10, wherein the repair circuit comprises:
- a selection control circuit configured to provide a control signal having a first logic level responsive to information stored by the storage circuit indicating all of the memory of the first plurality of memory devices is operable and configured to provide the control signal having a second logic level responsive to information stored by the storage circuit indicating that at least one memory of the first plurality of memory devices is inoperable; and
- a channel selection circuit configured to provide a stack identification signal based on the information stored in the storage circuit and the control signal provided by the selection control circuit.

12. The apparatus of claim 11, wherein the selection control circuit comprises a plurality of logic gates and the channel selection circuit comprises a plurality of multiplexer circuits configured to provide a respective select signal, wherein the control signal is provided to the plurality of multiplexer circuits to control selection by the multiplexer circuits.

13. An apparatus, comprising:
- a plurality of core dies stacked with one another via through-substrate/silicon vias (TSVs), the plurality of core dies comprising a first core die assigned to a first channel, a second core die assigned to a second channel, a third core die assigned to the first channel and a fourth core die assigned to the second channel; and
- control circuitry configured to:
  - responsive to the first core die being designated as an inoperable die, access the third core die through the first channel in place of accessing the first core die; and
  - responsive to the first core die not being designated as an inoperable die, access the first core die through the first channel.

14. The apparatus of claim 13, wherein each of the first and third core dies is configured to receive a same control signal, and each of the second and fourth core dies is configured to receive another same control signal.

15. The apparatus of claim 13 further comprising an interface die over which the plurality of core dies is stacked; wherein the interface die comprises a storage circuit configured to store control information; and
wherein the control information includes first information designating the first core die as an inoperative die and second information designating the third core die as an operative die.

16. The apparatus of claim 15, wherein the control information further includes third information designating the one of the second and fourth core dies as an operative die and fourth information designating the other of the second and fourth core dies as an inoperative die.

17. The apparatus as claimed in claim 15, wherein the store control information comprises a plurality of first defective signals corresponding respectively to the first and second core dies and a plurality of second defective signals corresponding respectively to the third and fourth core dies, and wherein the control circuitry is further configured to receive a plurality of stack ID signals each of which designates a respective one of the first, second, third and fourth core dies, and the control circuitry comprises:
- a plurality of first logic circuits each of which is configured to receive a respective one of the first defective signals and a respective one of the second defective signals and provide a first output signal;
- a second logic circuit coupled to the first logic circuit and configured to receive the first output signal of the first logic circuit and provide a second output signal in response, at least in part to, the first output signals; and
- a plurality of selector circuits coupled to the second logic circuit, each of the selector circuits is configured to receive a respective stack ID signal and a respective first defective signal and output one of the respective stack ID signal and the respective first defective signal in response to the second output signal.

18. The apparatus as claimed in claim 13 further includes a fifth core die stacked with the first core die and the second core die and wherein the control circuitry is formed in the fifth core die.

19. The apparatus of claim 18, wherein each of the plurality of core dies comprises:
- a chip identification counter circuit configured to provide a respective chip identification count;
- a comparison circuit configured to compare the respective chip identification count to a respective select signal from the control circuitry, and further configured to provide an active activation signal responsive to a match between the respective chip identification count and the respective select signal and to provide an inactive activation signal responsive to no match between the respective chip identification count and the respective select signal; and
- a command circuit configured to perform memory operations responsive to the active activation signal and to be inactive responsive to the inactive activation signal.

20. The apparatus of claim 19, wherein each die of the plurality of core dies further comprises a transmitter control circuit configured provide a clock signal and control signals to other die of the plurality of core dies when activated by the inactive activation signal and configured to not provide the clock signal and the control signals to other die of the plurality of core dies when not activated by the active activation signal.

* * * * *